United States Patent
Cohen

(10) Patent No.: US 7,359,464 B2
(45) Date of Patent: Apr. 15, 2008

(54) TRELLIS DECODER AND METHOD OF DECODING

(75) Inventor: Jeffrey S. Cohen, Acton, MA (US)

(73) Assignee: Intel Corporation, Santa Clara, CA (US)

( * ) Notice: Subject to any disclaimer, the term of this patent is extended or adjusted under 35 U.S.C. 154(b) by 722 days.

(21) Appl. No.: 10/749,482

(22) Filed: Dec. 31, 2003

(65) Prior Publication Data
US 2005/0147189 A1 Jul. 7, 2005

(51) Int. Cl.
*H03D 1/00* (2006.01)
*H04L 27/06* (2006.01)

(52) U.S. Cl. .................. 375/341; 375/262; 375/265; 714/794; 714/795; 714/796

(58) Field of Classification Search ............... 375/340, 375/265, 262, 341; 714/795, 796, 794
See application file for complete search history.

(56) References Cited

U.S. PATENT DOCUMENTS

| | | | |
|---|---|---|---|
| 4,979,175 A | 12/1990 | Porter | |
| 5,325,402 A | 6/1994 | Ushirokawa | |
| 5,946,361 A * | 8/1999 | Araki et al. | 375/341 |
| 6,256,352 B1 | 7/2001 | Chang | |
| 6,269,130 B1 | 7/2001 | Hansquine | |
| 6,317,472 B1 * | 11/2001 | Choi et al. | 375/341 |
| 6,378,106 B1 | 4/2002 | Allpress et al. | |
| 6,483,881 B1 | 11/2002 | Kim et al. | |
| 6,496,954 B1 | 12/2002 | Ono | |
| 6,587,519 B1 | 7/2003 | Tran et al. | |
| 6,591,395 B1 | 7/2003 | Tsai | |
| 6,594,795 B1 | 7/2003 | Satou | |
| 6,625,225 B1 | 9/2003 | Fukuda | |
| 6,654,929 B1 * | 11/2003 | Kamada | 714/795 |
| 6,792,570 B2 * | 9/2004 | Takahashi et al. | 714/795 |
| 7,139,968 B2 * | 11/2006 | Yamanaka et al. | 714/796 |
| 7,225,393 B2 * | 5/2007 | Kamada | 714/795 |

OTHER PUBLICATIONS

Gulak, P. Glenn et al., "Locally Connected VLSI Architectures for the Viterbi Algorithm", IEEE, Journal on Selected Area in Communications, vol. 6, No. 3; Apr. 1998; pp. 527-537.

(Continued)

*Primary Examiner*—Phuong Phu
(74) *Attorney, Agent, or Firm*—Blakely, Sokoloff, Taylor & Zafman LLP

(57) ABSTRACT

A trellis traceback apparatus and method are disclosed. In one aspect, the apparatus may include a branch indication memory, memory address logic, a selector, and a shift register. The memory may store branch indication information for a state at a section, the information indicating a branch that leads to the state. The memory address logic may indicate the section. The selector may receive the branch indication information for the state at the indicated section. The selector may select the branch indication information based on received selection information. The shift register may provide information stored in a plurality of register segments to the selector as the selection information, and the shift register may receive and store the selected branch indication information.

24 Claims, 6 Drawing Sheets

OTHER PUBLICATIONS

Shung, Bernard A., "Area-Efficient Artchitectures for the Viterbi Algorithm—Part I: Theory", IEEE Transactions on Communications, vol. 41, No. 4; Apr. 1993; pp. 636-644.

Fleming, Chip; A Tutorial on Convolutional Coding with Viterbi Decoding; (C) 1999-2003 Spectrum Applications. Retrieved on the Internet on Sep. 19, 2003. Retrieved on the Internet at: Http://home.netcom.com/~chip.f/vterbi/tutorial,html. pp. 1-6.

Fleming, Chip; A Tutorial on Convolutional Coding with Viterbi Decoding; (C) 1999-2003 Spectrum Applications. Description of the Algorithms, (Part 1). Retrieved on the Internet on Sep. 19, 2003. Retrieved on the Internet at: Http://home.netcom.com/~chip.f/vterbi/algrthms.html. pp. 1-7.

Fleming, Chip; A Tutorial on Convolutional Coding with Viterbi Decoding; (C) 1999-2003 Spectrum Applications. Description of the Algorithms, (Part 2). Retrieved on the Internet on Sep. 19, 2003. Retrieved on the Internet at: Http://home.netcom.com/~chip.f/vterbi/algrthms2,html. pp. 1-10.

* cited by examiner

TRELLIS DECODER AND METHOD OF DECODING

BACKGROUND

1. Field

An embodiment of the invention relates to the field of decoding in digital communications.

2. Background Information

A problem often encountered in communication systems is that errors may be introduced into the information that is transmitted over the communication link. Noise is a common contributing cause of the errors. A representative form of noise that may be expected is additive white Gaussian noise (AWGN), sometimes referred to in the arts simply as white noise. The white noise may potentially alter the characteristics of the carrier wave used to relay the modulated information. Such alteration of the carrier wave may cause the receiver to make errors when interpreting the received information. In a wireless communication system, such errors may be compounded by a generally low signal-to-noise ratio at the receiver, particularly when there is a large geographic distance between the transmitter and the receiver. Faulty equipment and other imperfections in the communication link may also contribute to the introduction of errors.

In the case of digital data, the noise may cause bit errors in which an information bit may be flipped. For example, a "1" may be flipped to a "0", or a "0" may be flipped to a "1". To further illustrate, a transmitter may transmit digital data (e.g., . . . 10110 . . . ) to a receiver, and the receiver may receive erroneous data (e.g., . . . 10111 . . . , where the error involves the last bit of the transmitted data being "flipped" from a "0" to a "1"). Such errors, if left uncorrected, may be problematic.

Traditionally, a variety of error correction techniques have been employed to help identify and eliminate the errors. A common form of error correction technique for digital data streams is Forward Error Correction (FEC). Employing FEC may allow the receiver to identify the error (e.g., the flipped bit in the sequence . . . 10111 . . . ) and correct the error, by flipping the erroneous bit (e.g., to produce the original digital data . . . 10110 . . . ).

One of the more prevalent FEC techniques is convolutional encoding with trellis decoding. This technique is supported by numerous communications standards, including, but not limited to, ADSL and SHDSL broadband standards. Convolutional encoding may involve using sophisticated mathematical encoding algorithms or other logic to add redundant channel coding information to the information of interest. The redundant information may allow a receiver to detect and correct potential errors due to noise or other imperfections. The receiver may employ trellis decoding, for example Viterbi decoding, in order to interpret the encoded information, and to identify and eliminate the errors.

The inventor has recognized that complex logic has heretofore generally been needed in order to perform the trellis or Viterbi decoding. The complex logic tends to increase the time needed to design and validate decoders. Additionally, the complex logic tends to increase the physical size and cost of the decoders, and decrease the operating speed of the decoders.

BRIEF DESCRIPTION OF THE SEVERAL VIEWS OF THE DRAWINGS

The invention may best be understood by referring to the following description and accompanying drawings that are used to illustrate embodiments of the invention. In the drawings.

AILED DESCRIPTION

The inventor has discovered new and useful apparatus and methods that he hopes will greatly advance the arts of decoding and error correction. In the following description, numerous specific details are set forth. However, it is understood that embodiments of the invention may be practiced without these specific details. In other instances, well-known circuits, structures and techniques have not been shown in detail in order not to obscure the understanding of this description.

I. Exemplary Communication System

Figure 1:
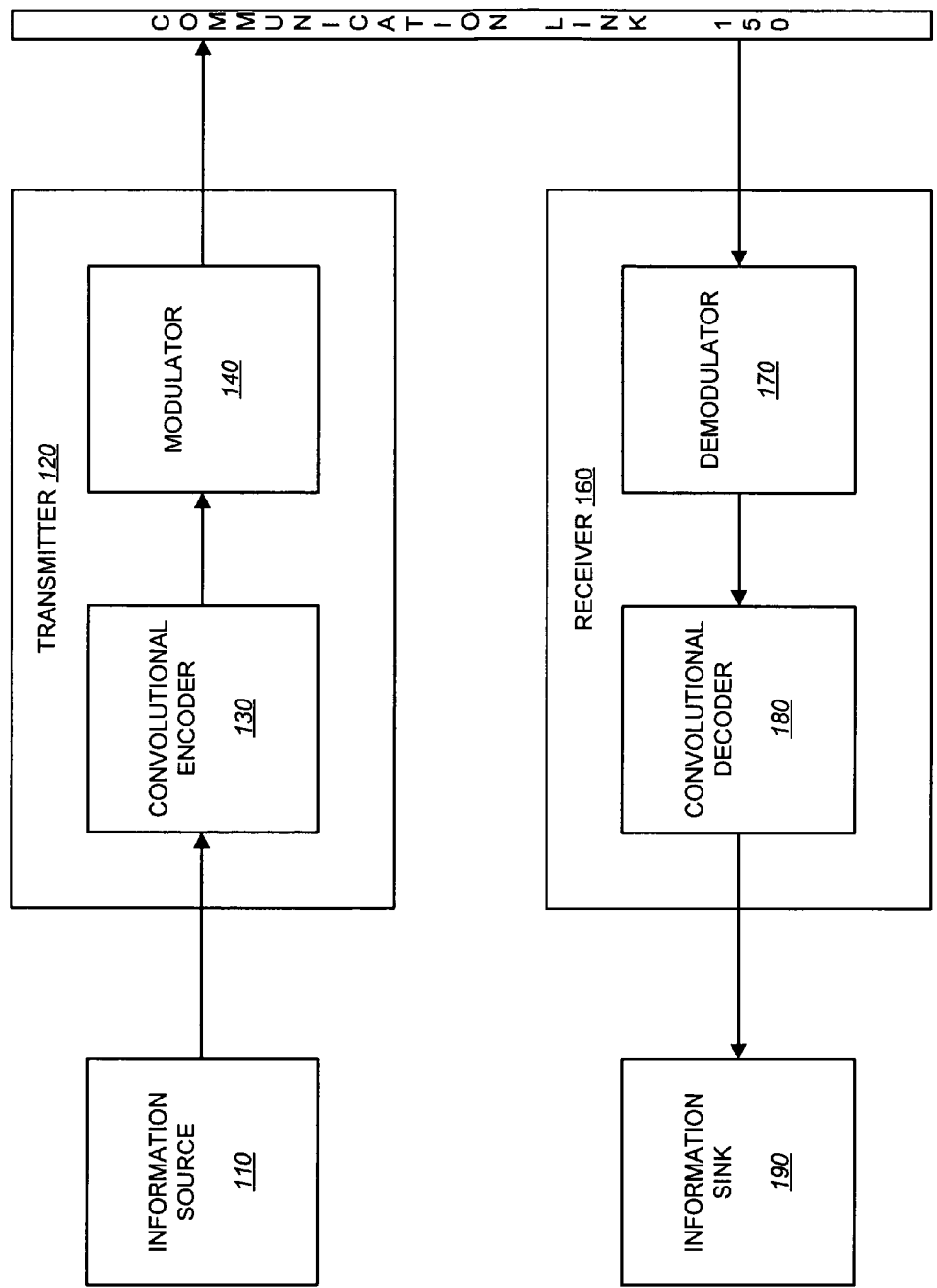
FIG. 1 is a block diagram of an exemplary communication system in which one embodiment of the invention may be implemented.

FIG. 1 shows an exemplary communication system 100 in which one embodiment of the invention may be implemented. The communication system includes an information source 110, a transmitter 120, a communication link 150, a receiver 160, and an information sink 190. The transmitter, which may include a computer system, modem, portable radio communication device (e.g., a cell phone), base station, or satellite, for example, is in communication with the information source, which may include a software application running on the computer system, or a microphone of the communication device, for example, in order to receive information. The transmitter includes a convolutional encoder 130. The convolutional encoder may receive the information and generate encoded symbols. As is known, the encoded symbols may include redundant information that may allow the receiver to perform error correction. The transmitter also includes a modulator in communication with the convolutional encoder. The modulator may receive and modulate the encoded symbols. The transmitter may then transmit the modulated symbols over the communication link.

The communication link may include a wired or wireless link. In one aspect, the communication link may include an x-Digital Subscriber Line (xDSL), although this is not required. Suitable xDSL include, but are not limited to, asymmetric DSL (ADSL), high-bit-rate DSL (HDSL), Integrated Services Digital Network DSL (IDSL), Single Pair High Speed Digital Subscriber Line (SHDSL), and single-pair symmetrical services DSL (SDSL). Taking ADSL as an example, the communication link may include a single wire pair, such as that conventionally used for telephone lines, to provide asymmetrical bandwidth such that the downstream bandwidth from the communication link to the subscriber (e.g., the receiver) is greater than the upstream bandwidth from the subscriber to the communication link. Now, as has been previously discussed, such communication links are often imperfect, for example due to noise, or due to faulty equipment.

The receiver, which may include a computer system, modem, portable radio communication device (e.g., a cell phone), base station, or satellite, for example, may receive the modulated symbols, along with any potential errors, from the communication link. The receiver includes a demodulator 170. The demodulator may receive and demodulate the modulated symbols. The receiver also includes a convolutional decoder 180, according to one embodiment of the invention. The convolutional decoder may receive the demodulated symbols, which are in an encoded format, and perform decoding. The decoding may allow the receiver to perform error correction, and recover the information initially provided from the information source. This information may be provided to the information sink, such as a software application on the computer system, or a speaker of the communication device, for example.

In the above-described communication system, the information source, the transmitter, the convolutional encoder, the modulator, the communication link, the demodulator, and the information sink may all include conventional components that are well known in the art of digital communications. The invention does not require that these components be conventional, but they may be, and accordingly will not be discussed in further detail, in order to avoid unnecessarily obscuring the description.

Now, the present inventor has recognized that a potential problem with many prior art convolutional decoders is that rather complex logic has heretofore been employed in order to perform the decoding. Such complex logic tends to increase the time needed in order to design and validate the decoders. Additionally, the complex logic tends to increase the physical size and cost of the decoders, and decrease the operating speed of the decoders. The inventor has discovered new and useful decoders including new and useful trellis traceback apparatus. He hopes that these apparatus may greatly advance the art of decoding and error correction in digital communications.

II. Exemplary Convolutional Encoding

As discussed above, the convolutional encoder may be conventional. However, prior to discussing the decoders and trellis traceback apparatus, it may be helpful to briefly review an exemplary encoding process.

Figure 2:
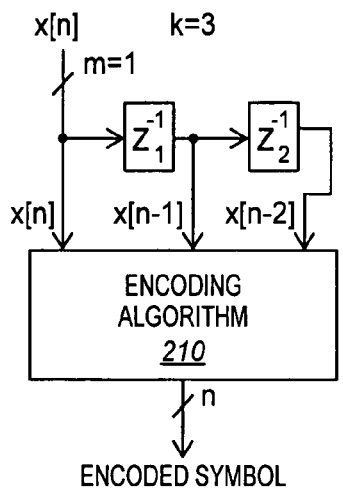
FIG. 2 is a block diagram of an exemplary convolutional encoder that may be used to convolutionally encode symbols, according to one embodiment of the invention.

FIG. 2 is a block diagram of an exemplary convolutional encoder 200 that may be used to convolutionally encode symbols, according to one embodiment of the invention. Convolutional encoding generally refers to a type of error-correction code in which each m-bit information symbol to be encoded is transformed into an n-bit symbol, where n>m, and in which the transformation is a function of the last k information symbols, where k is the constraint length of the code. In the exemplary convolutional encoder illustrated, the information symbol includes a single bit (i.e., m=1), and the constraint length, k, is equal to 3. It will be appreciated that this encoder is only illustrative, and that other encoders may also optionally be employed, for example encoders with constraint length up to about 9 have been employed in the arts, and are potentially suitable.

The encoder receives an input bit stream x[n], where x represents a binary value of a bit received at a time n. The bit stream may include a stream or train of ordered binary values, either 0's or 1's, which are received over time from the information source. By way of example, the bit stream may include a high-speed x-DSL data link.

Now, a common task of the convolutional encoder is to introduce redundant binary data into the bit stream so that error correction may be performed at the receiver. This redundant information may allow the receiver to detect and eliminate errors that may potentially be introduced into the data during transmission. The encoder includes an encoding algorithm 210 in order to generate an encoded symbol for each bit that is received from the bit stream. A number of conventional encoding algorithms, such as polynomial, other mathematical functions, combinatorial logic, or the like, may be employed, and will not be discussed in further detail in order to avoid obscuring the description.

It is often the case in convolutional encoding, that the encoded symbols are based on the current bit, as well as the past history of the bit stream. For example, the encoding algorithm may determine the encoded symbols based on one, two, or more prior bits of the bit stream. The encoder includes two serial unit delays $z_1^{-1}$ and $z_2^{-1}$ in order to delay a first bit received at time n−1 (i.e., x[n−1]) and a second bit received at time n−2 (i.e., x[n−2]) by one and two time periods, respectively. The current bit received at time n (i.e., x[n]), the first bit received at time n−1 (i.e., x[n−1]), and a second bit received at time n−2 (i.e., x[n−2]) may all be provided to the encoding algorithm in order to allow the encoding algorithm to generate the encoded symbol for the current bit x[n]. Each of the encoded symbols generated by the encoding algorithm may include a plurality of "n" bits, in which n is often two, or three. The bits of the encoded symbol may represent the received bit and include the previously described redundant information that may allow the receiver to perform error correction. As you can see, each bit (e.g., x[n−2]) may have an affect on three successive encoded symbols, which in part gives the convolutional encoding it's error correction capabilities.

Figure 3:
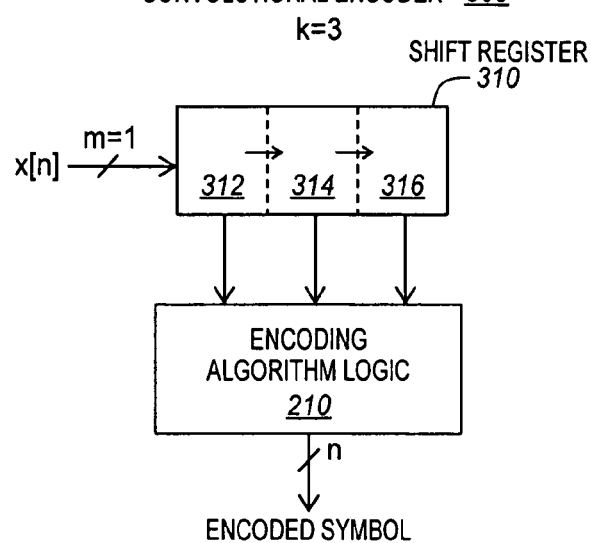
FIG. 3 is a block diagram of an exemplary convolutional encoder in which a shift register is used to implement unit delays, according to one embodiment of the invention.

A shift register is often used in the arts in order to implement the unit delays $z_1^{-1}$ and $z_2^{-1}$. FIG. 3 is a block diagram showing an exemplary convolutional encoder 300 in which a shift register 310 is used to implement unit delays, according to one embodiment of the invention. The shift register includes a least significant bit (LSB) register segment 312, a next-to most significant bit (MSB) register segment 314, and a MSB register segment 316. Each of the segments may be used to store a bit. The current bit x[n] may initially be provided to the LSB register segment. As this occurs, the bit x[n−1], which is currently in the LSB register segment, may be shifted into the middle register segment. Likewise, the bit x[n−2], which is currently in the middle register segment, may be shifted into the MSB register segment. This describes how the shift register may operate.

III. Exemplary Trellis Diagram

Figure 4:
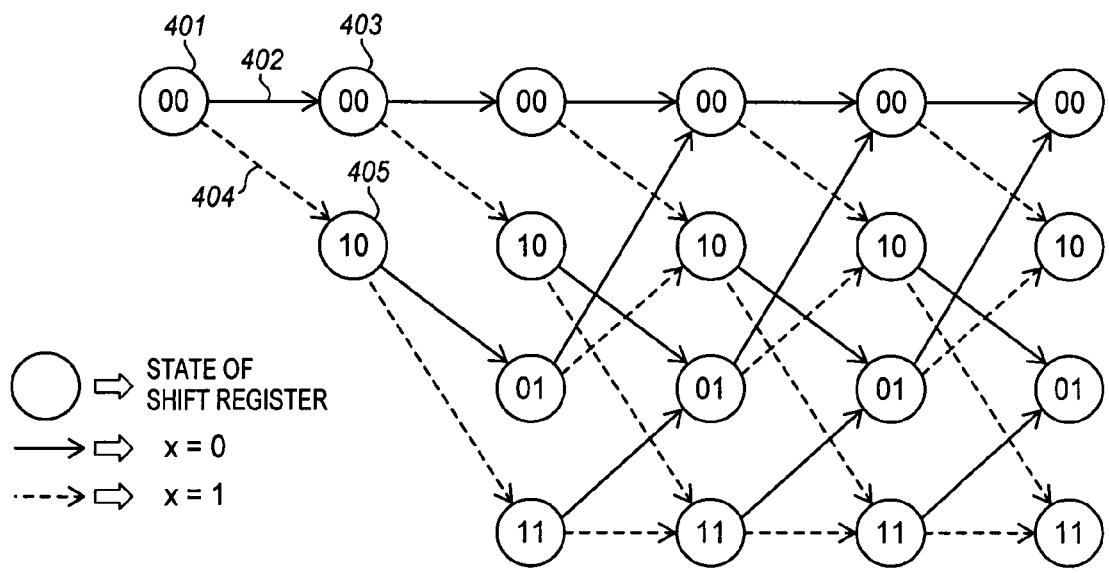
FIG. 4 shows a portion of an exemplary four-state trellis diagram, according to one embodiment of the invention.

FIG. 4 shows a portion of an exemplary four-state trellis diagram 400, according to one embodiment of the invention.

The trellis diagram may represent a state transition diagram showing the possible encodings for an input bit.

The major components of the trellis diagram are trellis states and trellis branches. Initially, let's discuss the trellis states, and then we'll discuss the trellis branches. The trellis states represent the two older values of the bit stream in the two MSB segments of the shift register of FIG. 3. For example, the trellis state for the current bit (i.e., x[n]) may include the last bit x[n−1], which is in the middle segment of the shift register, and the next-to-last bit x[n−2], which is in the MSB segment of the shift register. As a result of the two bits, the illustrated trellis diagram includes four unique trellis states. The trellis states are shown as rows of circular nodes. Thus, there are four rows each corresponding to a different state. The first row corresponds to state "00", the second row to state "10", the third row to state "01", and the fourth row to state "11".

Each of the trellis states is connected to a plurality of other trellis states by trellis branches. The trellis branches represent state transitions from a first state, at the beginning of the line, to a second state, at the end of the line. The state transitions are caused by the receipt of a next data bit in the bit stream to be encoded. Notice that the lines are either solid or dashed. The solid lines correspond to state transitions when the input bit is a "0", while the dashed lines correspond to state transitions when the input bit is a 1. Notice from the diagram that, in the case of a 1:2 convolution encoder where m=1 and n=2, there are two branches leading away from each trellis state, and two branches leading into each trellis state. Also notice that one of the trellis branches leaving a state corresponds to the received bit being a "0" and the other of the trellis branches leaving a state corresponds to the received bit being a "1". In this particular case, the trellis branch corresponding to the received bit being a "0" is the upper of the two trellis branches. In the alternate case of a m>1 convolution encoder, for example a 2:3 convolution encoder that may be employed in ADSL, there may be more than two branches leading from, and leading into the trellis states.

To further illustrate the concepts, let's trace through a section of the trellis diagram. Starting at a first trellis state 401, which is the state "00", there are two possible trellis branches leading away from this state. Either of these trellis branches may be taken, depending upon the value of the first bit in the bit stream to be encoded. A first trellis branch 402 leading to a second trellis state 403, which is the state "00", may be taken if the first bit has a value of "0". Alternatively, a second trellis branch 404 leading to a third trellis state 405, which is the state "10", may be taken if the first bit has the value of "1". That is, branch 402 corresponds to the first data bit being "0", and branch 404 corresponds to the first data bit being "1". With reference to the shift diagram of FIG. 3, it is readily seen that a next trellis state may be determined from a preceding trellis state, by simply shifting the state transition bit into the next-to MSB segment of the shift register. For example, in the case of "00", if a state transition bit with a value of "1" is received (e.g., along branch 404), then, after shifting, the "1" is shifted into the next-to MSB segment of the shift register, and the "0" previously in the MSB segment of the shift register is shifted out of the shift register, leaving the contents "10" (e.g., third state 405). It is perhaps most easily seen how the trellis diagram is tied to the shift register, by considering a train of "0" passing through the shift register, and noticing that this corresponds to following the state transitions connecting the "00" trellis states along the top row of the trellis diagram. Thusly, with reference again to the encoder of FIG. 3, it is seen that the three bits of input to the encoding algorithm is simply a trellis state (e.g., trellis state 401, and the current bit corresponding to the trellis branch leading away from that state (e.g., "1" for branch 404).

The trellis diagram may also be looked at from another perspective. Table 1 is a state transition table indicating the next state given the current state and the input bit for the trellis diagram of FIG. 4.

TABLE 1

| | Next State, If | |
|---|---|---|
| Current State | Input = 0 | Input = 1 |
| 00 | 00 | 10 |
| 01 | 00 | 10 |
| 10 | 01 | 11 |
| 11 | 01 | 11 |

IV. Exemplary Convolutional Decoding

Figure 5:
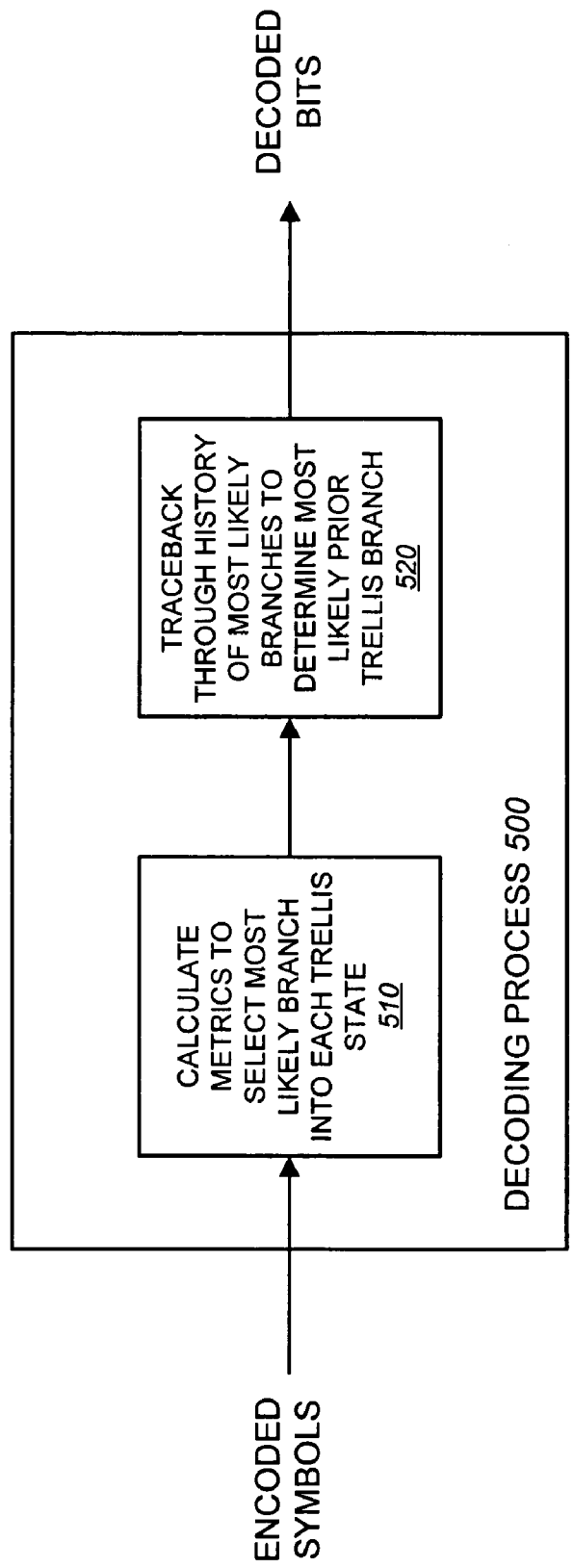
FIG. 5 is a block flow diagram of a trellis decoding process, according to one embodiment of the invention.

Now that we've reviewed an exemplary encoding process, let's consider how the encoded symbols may be decoded. FIG. 5 is a block flow diagram of a trellis decoding process 500 for convolutional encoding, according to one embodiment of the invention. Overall, the decoding process receives encoded symbols, as input, and decodes the symbols in order to correct errors and generate decoded bits, as output. In the particular case illustrated in FIG. 2, this may correspond to converting the stream of symbols on n-bits back to the stream of bits x[n].

The decoding process is divided into two portions. In a first portion, the encoded symbols may be used to calculate metrics in order to select a most likely branch into each trellis state, at block 510. In convolutional decoding, the decoder may make calculations based on what symbols were actually received and what could possibly have been received given the state of the encoder. A prevalent form of convolutional decoding is Viterbi coding. Viterbi decoding may refer to a maximum likelihood decoding algorithm in which the decoder uses a trellis structure and calculates a distance, such as a Hamming or Euclidian distance, between received and valid code words. The decoder may use these calculations to eliminate errors. In short, the decoder may attempt to identify the best or most likely match between the received information, which may potentially include errors, and information that is allowable in view of the algorithm used to generate data.

Let's consider this in greater detail, in order to better illustrate the concepts. Let's consider an example in which we start at the initial state "00" (e.g., state 401), given an input bit, with a value of either "0" or "1", there are only two states we could transition to, and two possible outputs of the encoder. By way of example, depending upon the particular encoding algorithm, let's consider the possible outputs from current state "00" are "00" if the input bit is "0", and "11" if the input bit is "1". This is the encoder output.

Initially, distance metrics may be computed for the pair of received symbols. The distance metrics may essentially measure the "distance" between the symbols that were actually received and the symbols that could possibly have been received given the encoder. The Hamming distance is an exemplary distance metric known in the arts. Hamming distances may be computed by counting the number of bits that are different between the received symbol pair and the possible channel symbol pairs. For example, the number of bits that are different may be zero, one, or two. A Hamming distance may be computed for a branch between a prior state and a current state.

Referring again to our example, in which we start with the current state of "00" (e.g., state 401), and we receive an input bit. The only possible outputs of the encoder under such conditions are "00" and "11". Consider that we actually received "00". The Hamming distance between "00" and "00" is zero. The Hamming distance between "00" and "11" is two. Therefore, the branch metric value for the branch (e.g., branch 402) leading from state "00" (e.g., state 401) to state "00" (e.g., state 403) is zero, and for the branch (e.g., branch 404) leading from state "00" (e.g., state 401) to state "10" (e.g., state 405) is two. These Hamming distances are also known in the arts as branch metrics. The Hamming distances or branch metrics may be added or otherwise accumulated for a series of branches in order to determine an accumulated error metric for the series of branches, or series of symbol pairs. Since this is the first branch, the accumulated error metric values for states "00" (e.g., state 403) and state "10" (e.g., state 405) are equal to the branch metric values.

This procedure may be repeated for additional symbol pairs. Each of the subsequent branch metric values may be added to the previous accumulated error metric values associated with each state that we came from to get to the current states. The accumulated error metrics for each state may simply be carried forward in time for each state of the trellis. These accumulated error metrics are also known in the arts as path metrics. The path metrics of which there may be $2^{k-1}$, where k is the constraint length of the convolution encoder, may quantify the likelihood of each path, or series of received symbols, to be the actual transmitted path, or series of transmitted symbols. At some point, the accumulated error metrics associated with each branch may be compared, and the larger one of each pair of branches leading into a given state may be discarded. If cases where accumulated error metrics are equal, a fair coin toss, a consistent pick, or other known approaches may be used to decide the surviving branch.

In any event, the overall process may involve adding the previous accumulated error metrics to the new branch metrics, comparing the results, and selecting the smallest accumulated error metric that is to survive and continue on through the trellis. This overall process is often known in the arts as Add/Compare/Select (ACS). Although the ACS process has been described in some detail, the overall process is substantially unchanged by the present disclosure. A result of the ACS process may be an ability to select the most likely branch into each trellis state.

Referring again to FIG. 5, a most likely prior trellis branch may be determined by tracing back through a history of most likely branches, at block 520. This may be repeated for a plurality of most likely prior trellis branches in order to determine a most likely path through the trellis. The ability to determine the most likely transmitted data stream may result naturally from the ability to determine the most likely path through the trellis each time a symbol is received and processed. That is, defining a most likely branch from a particular first state to a particular second state corresponds to defining the most likely data bit value that caused the state transition via the branch. In a sense, the most likely path through the trellis may correspond to a most likely string of particular trellis branches and states. This, in turn, may correspond to a most likely string of data stream values.

In one embodiment of the invention, a trellis traceback unit may be employed to trace back through the history of most likely branches. Several exemplary trellis traceback apparatus are disclosed in the following sections.

V. Exemplary Trellis Traceback Apparatus

Figure 6:
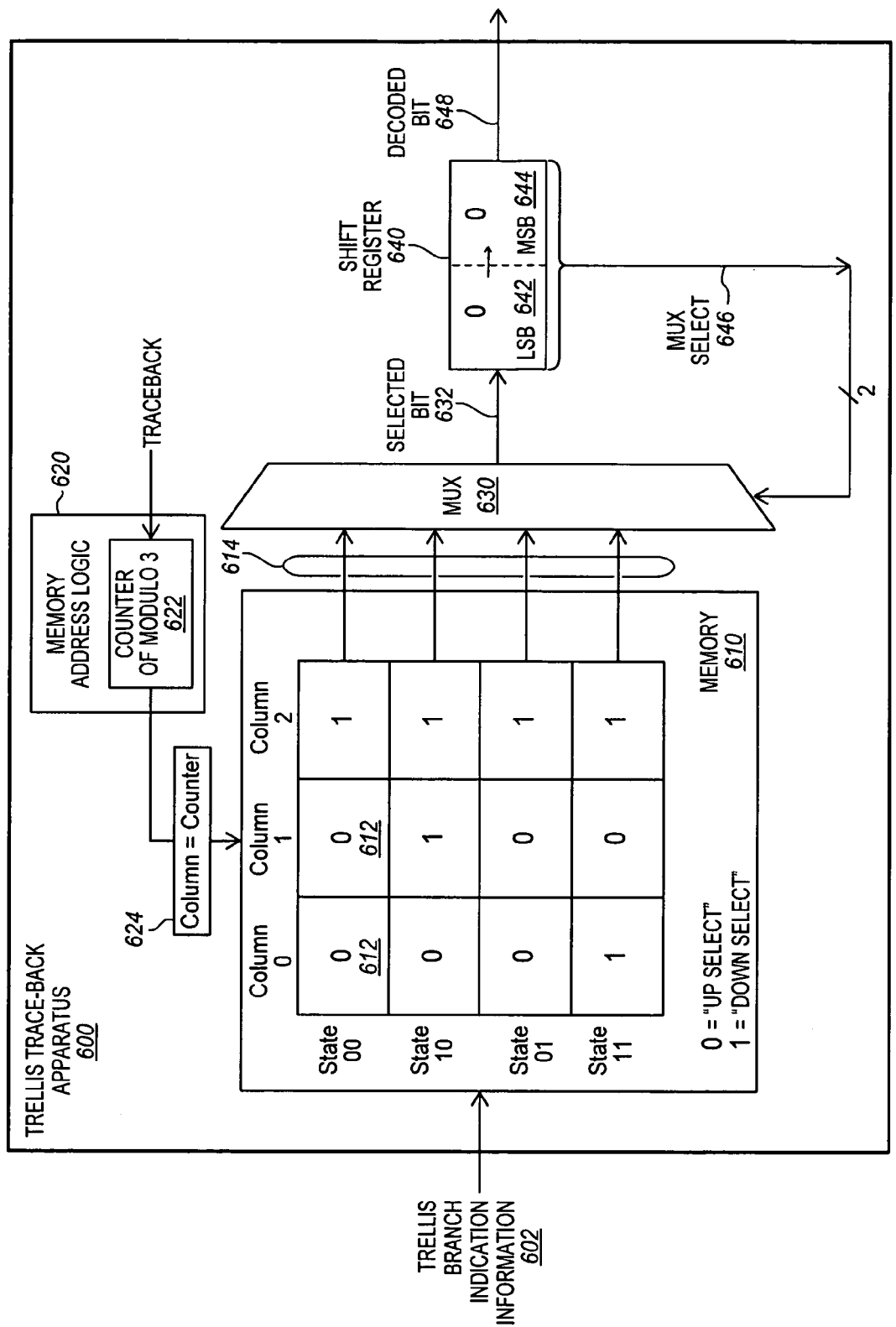
FIG. 6 is a block diagram of an exemplary trellis traceback apparatus to traceback through a trellis in order to generate decoded bits, according to one embodiment of the invention.

FIG. 6 is a block diagram of an exemplary trellis traceback apparatus 600 to traceback through a trellis in order to generate decoded bits, according to one embodiment of the invention. The apparatus may perform four state, 1:2 convolutional decoding. The trellis traceback apparatus includes a trellis branch indication memory 610, memory address logic 620, a multiplexer 630, and a shift register 640. Each of these components will be described briefly below, and then an example of decoding using the apparatus will be explained.

Let's start with the trellis branch indication memory 610. The trellis branch indication memory may be in communication with conventional logic, such as metric calculation logic, and Add/Compare/Select (ACS) logic, in order to receive selected trellis branch indication information 602. In one embodiment of the invention, the trellis branch indication memory may include a SRAM (static random access memory), for example a dual-port read/write SRAM memory having two interfaces with read and write capabilities. One of the two interfaces may be in communication with the metric calculation logic in order to receive the trellis branch indication information into the memory, and the other interface may be used to read the information out of the memory, as will be discussed further below. The use of a SRAM memory is not required, and other types of memory may also optionally be employed. Often, the memories that are employed should have read-write capabilities, and should have sufficient speed to support the symbol rate of the particular implementation.

The trellis branch indication memory includes a plurality of memory locations, which are each generally represented at 612. The plurality of memory locations includes memory locations for each of a plurality of states of the trellis, at each of a plurality of trellis sections. The states of the trellis are organized into rows. There are four rows, one for each state of the trellis. The states are organized into rows in a predetermined order. The first row corresponds to the state "00", the second row corresponds to the state "10", the third row corresponds to the state "01", and the fourth row corresponds to the state "11". The trellis sections are organized into columns. There are three columns, corresponding to a traceback depth of three symbols. A memory location at each column address and row location may be used to store trellis branch indication information.

Before proceeding, it is worth mentioning that the particular dimensions of the memory described immediately above are not required. These particular dimensions are primarily selected to facilitate the description. Different dimensions may be used depending upon the constraint length and the traceback depth. The constraint length may be determined by the encoder employed in the transmitter (see e.g., FIG. 2). The constraint length may determine the number of states, and consequently the number of rows of the trellis branch indication memory. Accordingly, the constraint length may also determine, for a given column of the memory, the number of bits that are needed to uniquely specify a particular row. We will briefly mention here, and explain in further detail below, that the constraint length may also determine the number of register segments of the shift register, which as will be discussed, may be used to uniquely specify a particular row, and state.

Likewise, as is known, the traceback depth may determine, at least in part, the capability of the decoder for error correction. A greater traceback depth may imply accumulation of more symbols prior to traceback and symbol decision. This may mean that the symbol decisions are made based on more data points, or more history, and may afford greater error correction capabilities. Accordingly, a greater traceback depth may be employed to provide greater error correction, or a lesser traceback depth may be employed to provide lesser error correction. After a point, a greater depth may provide a diminishing return on improved error correction. At the same time, the greater depth increases the initial latency encountered when filling the memory, and the time and logic to traceback through the memory. Thus, there is often a balance or "sweet spot" depth, which may depend on the relative importance of latency and error correction for the particular implementation. The traceback depth may determine the number of columns in the trellis branch indication memory. Often, in order to have satisfactory tradeoff between error correction and latency, it may be appropriate to employ a traceback depth of 2 to 8, or 3 to 6 times the constraint length (k), which may set the number of columns. The relatively short depth of the illustrated memory is only to illustrate the general concepts, and often much greater depths will be appropriate. In exemplary working prototypes developed by the present inventor, a depth of 64 was used for SHDSL, and a depth of 32 was used for ADSL. Accordingly, the illustrated trellis branch indication memory is only exemplary, and other sizes and dimensions may also optionally be employed. Typically, the constraint length, and the traceback depth should be such that applicable communications standards, for example those of ADSL, SHDSL, or other standards, are met.

Referring again to FIG. 6, the received trellis branch indication information may be stored into each of the memory locations. As shown, exemplary trellis branch indication information has been stored in each of the memory locations. Column 0 includes, from top to bottom, the binary values 0, 0, 0, 1; column 1 includes, from top to bottom, the binary values 0, 1, 0, 0; and column 2 includes, from top to bottom, the binary values 1, 1, 1, 1. As previously discussed, the trellis branch indication information is typically calculated externally to the trellis traceback apparatus by conventional logic, for example with the use of metric calculation logic, and ACS logic, and the trellis branch indication information is stored in the memory prior to traceback.

The trellis branch indication information may indicate a trellis branch that is most likely to lead to a trellis state corresponding to a particular memory location that is used to store the trellis branch indication information. In the case of a 1:2, four state decoder, there may be two branches leading to each state of the trellis. In this example, the two branches may be characterized as an upper branch and a lower branch. The trellis branch indication information may indicate the branch with the lower accumulated error, for example the smaller path metric. In one aspect, the trellis branch indication information may embody an up-down select (UDS) that indicates either an "up select" or a "down select". An "up select" may indicate that the upper branch is most likely, while a "down select" may indicate that the lower branch is most likely.

In the illustrated embodiment of the invention, a "0" is used, by convention, to indicate an "up select", and a "1" is used, also by convention, to indicate a "down select". Let's consider this in further detail. Refer briefly to the trellis branch indication information stored in row 0, column 2, which includes a "1". This "1" may indicate that a lower branch most likely lead to the state "00" at that trellis section. In another embodiment of the invention, as in the case of a 2:3 decoder, the selected one of four branches leading to a trellis state may be uniquely indicated and stored in the memory with two bits representing the branch's physical location relative to the other branches. Often, the trellis branch indication information may include one or a plurality of bits sufficient to uniquely indicate a trellis branch that produced the smallest path metric leading to a trellis state.

Now that we have discussed the trellis branch indication memory, and the trellis branch indication information, let's turn to a discussion of the memory address logic 620, the MUX 630, and the shift register 640, which cooperate to selectively traceback through the trellis branch indication memory, and selectively read information out of the memory, in order to recover the decoded and error corrected bits. The memory address logic will be discussed first, then the MUX will be discussed, and then the shift register will be discussed.

The memory address logic 620 is in communication with the trellis branch indication memory 610 and may provide a memory address 624 to the trellis branch indication memory. The memory address logic includes a counter 622. The counter has modulo equal to or at least based on the traceback depth of the memory. In this particular instance the counter has modulo equal to 3. In one aspect, the counter may include both an up counter to write trellis branch indication information into the memory, and a down counter to subsequently read the trellis branch indication information from the memory. A single counter embodying both up and down count capabilities may be employed, or alternatively separate up and down counters may be employed, as appropriate. In the illustrated embodiment, the memory address may specify a column read address that is simply the value of the counter. When tracing back through the memory, initially, the value of the counter may be at the last address written. The trellis branch indication information may be read out of the indicated column. In a sense, the memory read address may indicate a subset of the plurality of memory locations of the memory that store UDS for each of the trellis states at a particular trellis section. Then the value of the counter may be de-incremented and the information in column 1, and then column 0, may be read from the memory, as traceback progresses.

Now, a potential advantage of using the counter for memory address logic is its simplicity. The counter used to address (e.g., read and write) the memory may offer the advantage of highly simplified logic that should be easy to design, validate, and incorporate into trellis traceback apparatus. This may correspond to a reduced size and cost and increased speed of decoders.

Now let's refer to the multiplexer (MUX) 630. The MUX may represent a selector or selection device to select an input. The use of a MUX is not required and other selectors or selection devices known in the arts may also optionally be employed. The MUX is in communication with the trellis branch indication memory 610 and with the shift register 640. The MUX may receive addressed trellis branch indication information 614 from the memory. In the illustrated embodiment, the MUX may receive a plurality of UDS, one for each of the four states of the trellis, at a trellis section, or column, that is indicated by the memory address. For example, the trellis branch indication information 1, 1, 1, 1 may initially be read from column 2 of the trellis branch indication memory.

The MUX may also receive, as input, MUX selection information 646 from the shift register 640. The illustrated shift register includes two register segments or cells. In particular, the illustrated shift register includes a least significant bit (LSB) segment 642 and a most significant bit (MSB) segment 644. In one aspect, the shift register may be implemented as a chain of flip-flops, where the output of the $n^{th}$ flip-flop is in communication with the input of the $(n+1)^{th}$ flip-flop. Each of the register segments may be used to store a bit of information. Based on the metric calculations, the path with the lowest path metric may be selected as a starting point for traceback, and the bits designating the terminating state may be stored in the shift register prior to traceback. In the illustrated embodiment, by convention, each of the register segments may initially store a value of "0", or another appropriate termination state of the most likely path. The initial values are arbitrary, and others values may also optionally be employed.

The MUX selection information may include the contents of the shift register. For example, the shift register may provide the two bits "00" to the MUX as the MUX selection information 646. The two bits "00" are sufficient to uniquely select one of the four states of the trellis. The number of segments of the shift register may be based upon the number of states of the trellis in order to allow the bits stored in the shift register to be sufficient to uniquely select one of the states. The MUX may use the received bits "00" to select a portion of the trellis branch indication information read into the MUX from a particular column of the memory. In particular, the MUX may select the trellis branch indication information for a particular state, or row, indicated by the received bits "00". For example, when the data is read from column 2, the MUX may select the "1" in the top row, since the top row corresponds to state "00", which is the state indicated by the MUX select information "00".

Thus, to summarize so far, the memory address 624 provided by the memory address logic 620 may allow reading all of the trellis branch indication information in an addressed column or trellis section of the trellis branch indication memory. Then, the MUX select information provided by the shift register may allow uniquely selecting a portion of the trellis branch indication information, for example a "1" or a "0", corresponding to a particular state that is identified by the MUX select.

The selected trellis branch indication information, which may include a UDS bit, may be provided as a selected bit 632 to the shift register. The shift register 640 has two couplings or communications with the MUX 630, one in order to provide the previously described MUX select information 646 to the MUX, and another in order to receive the selected bit 632 from the MUX. The register segments or cells of the shift register may be used to store the received selected bits of trellis branch indication information.

In particular, the selected bit 632 may be shifted into and stored in the LSB segment 642 of the shift register. Now, the shift register may operate to shift the bits stored in the register segments by one bit position from the LSB segment toward a most significant bit (MSB) segment. In the illustrated embodiment, the shift register may operate to shift the contents of its register segments by one digit position to the right (as viewed) per column read in the traceback operation, upon being clocked. As the first selected bit is received into the LSB segment, the initial value of "0" stored in the LSB segment may be shifted into the MSB segment, and the initial value of "0" stored in the MSB segment may be shifted out of the shift register. Likewise, as additional selected bits are received from the MUX, the initial values of "0" may thusly be serially shifted out of the register. These initial "0" values may be discarded.

Now, after all the columns of the trellis have been read, the next bit shifted out of the MSB segment of the shift register may include a decoded bit 648. The trellis traceback operation may be performed each time a symbol is received and processed for a most likely path, after the initial latency of filling the trellis. For each traceback operation, a single decoded bit or symbol may be determined. The traceback may begin with the last column to which data was written to and ends with the earliest column to which data was written. The counter may simply wrap around to reach all addresses of the memory.

VI. Example of Traceback

So far, we've discussed several examples of how the trellis traceback apparatus may operate to traceback through the indicated branches of the memory in order to recover error corrected bits of information. However, in order make the operation more clear, let's consider right now a detailed working example, from start to finish. This detailed example is used to illustrate certain concepts and does not limit the invention.

Initially, the trellis branch indication information may be stored in the memory. This is the "0" and "1" values populating the illustrated memory. Also, the termination state of the path having the smallest path metric, or the most likely path, in this case "00", may be stored in the shift register.

Then, the memory address logic may provide a first memory address to the memory. The down counter may initiate at its highest counter value, which in this case is 2. Based on this counter value, the first memory address may include an indication of column 2. Note that column 2 may include branch indication information for the "most recent" encoded symbols.

The trellis branch indication information indicated by the read address may be read out of the memory and provided to the MUX. One UDS bit of trellis branch indication information may be read into the MUX for each of the four states of the trellis. In the case of reading from column 2, the values 1, 1, 1, 1, may be read into the MUX.

Then, the shift register, which may initially contain the termination state of the most likely path, may provide the MUX select information to the MUX. The MUX select information may include the contents of the shift register. Initially, the contents of the shift register may also include "00", if the traceback depth is sufficiently large, since all paths should converge when tracing back through the trellis.

The MUX may receive the MUX select information. The MUX may use the received "00" to select trellis branch indication information that was received from the memory for the state "00". Note in the following discussion in this section that the contents of the shift register are given LSB to MSB while the states are identified from MSB to LSB. With reference to column 2, row 0, in this example, the selected information would be a "1". Note that, by convention, the "1" indicates a "down select". With reference to the trellis diagram of FIG. 4, a down select from state "00" would indicate that the next state would be "01". Then, the selected "1" may be provided as the selected bit 632 by the MUX.

The shift register may receive the selected bit. The selected "1" may be stored in the LSB segment of the shift register. As the "1" is stored in the LSB segment, the "0" initially stored in the LSB segment may be shifted into the MSB segment, and the "0" initially stored in the MSB segment may be shifted out of the shift register. Since we have not yet traced all the way back through the trellis, the "0" may be regarded as irrelevant and may simply be discarded. The new contents of the shift register may include "10".

Then, the counter may be de-incremented. The memory address logic may provide a second read address including an indication of column 1. The trellis branch indication information may be read out of column 1 and provided to the MUX. With reference to column 1, the values 0, 1, 0, 0, may be read and provided to the MUX. Then, the contents of the shift register may be provided to the MUX. At this point, the current contents of the shift register are "10". The MUX may receive the "10" and select the "0" corresponding to state "01", of column 1. Note that the "0" indicates an "up select", which according to the trellis diagram (see e.g., FIG. 4) would lead to state "10". Then, the selected "0" may be provided to the shift register. The shift register may receive and store the selected "0" in the LSB segment. As the "0" is stored in the LSB segment, the existing "1" in the LSB segment may be shifted into the MSB segment, and the existing "0" in the MSB segment may be shifted out of the shift register, and discarded. After shifting, the new contents of the shift register may include "01".

Then, the counter may again be de-incremented. The memory address logic may provide a third read address including an indication of column 0. The trellis branch indication information may be read out of column 0 and provided to the MUX. With reference to column 0, the values 0, 0, 0, 1, may be read and provided to the MUX. Then, the contents of the shift register may be provided to the MUX. At this point, the current contents of the shift register are "01". The MUX may receive the "01" and select the "0" corresponding to state "10", of column 0. Note that the "0" indicates an "up select", which according to the trellis diagram would lead to state "00" (see FIG. 4). Then, the selected "0" may be provided to the shift register. The shift register may receive and store the selected "0" in the LSB segment. As the "0" is stored in the LSB segment, the existing "0" in the LSB segment may be shifted into the MSB segment, and the existing "1" in the MSB segment may be shifted out of the shift register. Since the traceback depth has been completely traced back, the "1" that has been shifted out is the error-corrected and decoded bit 648.

VII. Another Exemplary Trellis Traceback Apparatus

Figure 7:
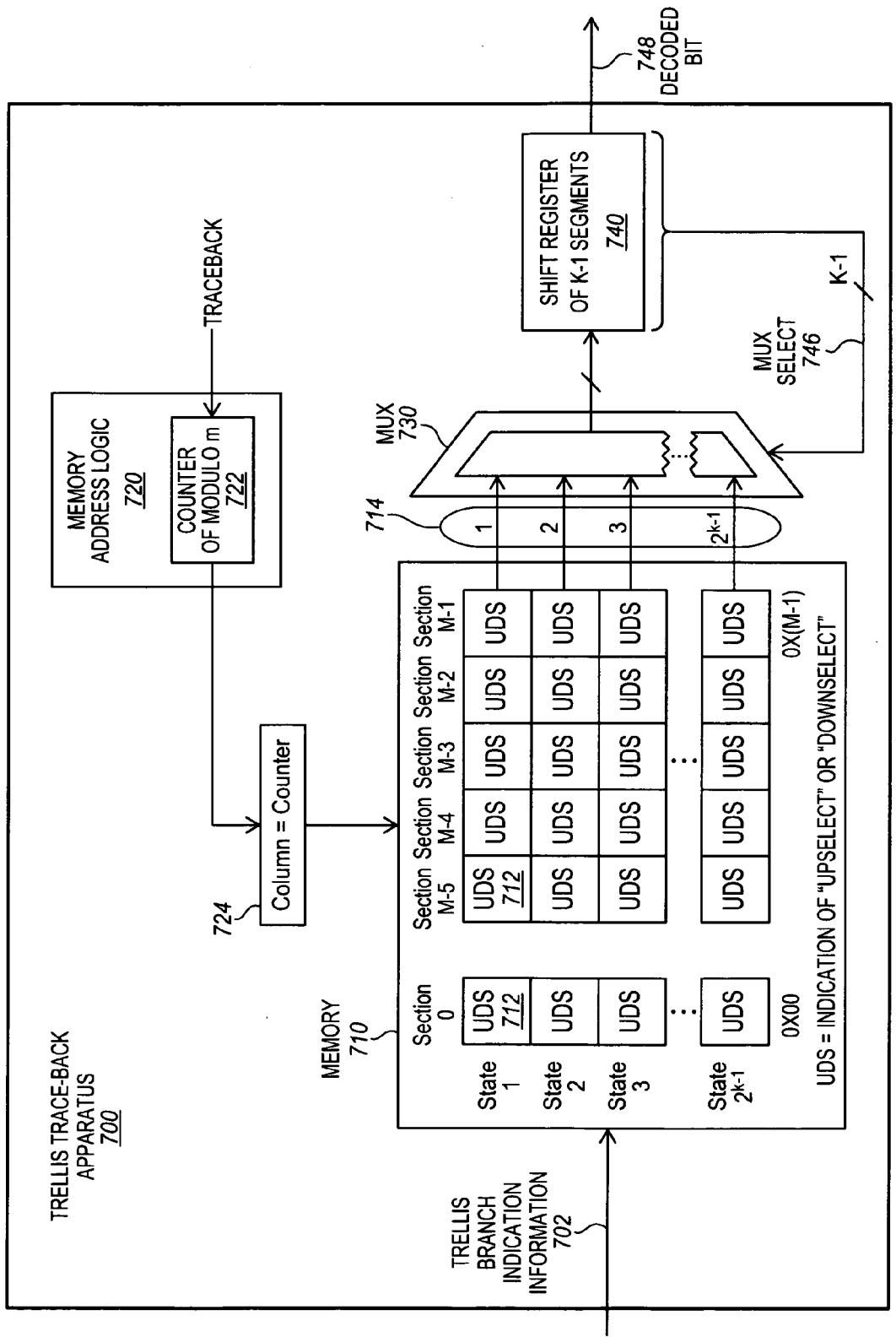
FIG. 7 is a block diagram of a trellis traceback apparatus, according to another embodiment of the invention.

FIG. 7 is a block diagram of a trellis traceback apparatus 700, according to one embodiment of the invention. The apparatus, including its components, their connectivity, and their methods of operation, may be similar to those of the apparatus shown in FIG. 6, and previously discussed in detail. The discussion below will focus primarily on the different and/or additional features.

The trellis traceback apparatus includes a trellis branch indication memory 710, memory address logic 720, a multiplexer 730, and a shift register 740. Each of these components is shown for the case of a constraint length k, and a traceback depth m, where k and m are integers.

The trellis branch indication memory 710 includes memory locations for states 1 through $2^{k-1}$ (i.e., $2^{\wedge}(k-1)$), at each of trellis sections 0 through m−1. each of these memory locations may store an up-down select (UDS). In one embodiment of the invention, each bit of a word of size $2^{k-1}$ bits may be used to represent a UDS for a different state of the $2^{k-1}$ states at a particular trellis section, so that a word may be used to represent a section, or column of the memory.

The memory address logic 720 employs column address logic having a down counter 722 of modulo m. In this way, the down counter may simply count down from column m−1 through column 0 in the initial traceback, and thereafter from the last column written to the earliest column written, in order to generate the read addresses for tracing back through the memory. Each read address may allow reading the UDS for each of the $2^{k-1}$ trellis states at a particular column or trellis section corresponding to a current value of the down counter.

The multiplexer (MUX) 730 may receive a UDS for each of the $2^{k-1}$ states of the trellis at a column or trellis section that is indicated by the memory address. The MUX may also receive, as input, MUX selection information 746 including k−1 bits. These k−1 bits may include the contents of the shift register. The number of segments of the shift register may be based upon the number of states of the trellis, which may be based on the constraint length (k), in order to allow the bits stored in the shift register to be sufficient to uniquely select one of the states. For example, as shown in the illustrated embodiment, the shift register may include k−1 register segments in order to allow the MUX to use the bits stored therein to uniquely select a single UDS bit of the $2^{k-1}$ UDS bits.

Trellis traceback apparatus are not limited to the particular embodiments disclosed herein. Practitioners may make adaptations to different numbers of states, different dimensions of the path memory and shift register, and the like. In adapting the approach, the practitioner may configure the trellis diagram, the arrangement of states in a column, and the convention for using trellis branch indication information to designate a branch leading into a state, such that the trellis branch indication information, when shifted into the shift register, should subsequently allow selecting only states that follow allowed state transitions according to the trellis diagram. In one embodiment of the invention, the trellis diagram may be configured such that the allowed transitions from a first state to a second state are according to the following guidelines. Assume a first state that is identified by bits in a shift register. There may be a plurality of branches leading into the first state. Trellis branch indication information may be used to uniquely indicate the trellis branches leading to that state. The trellis branch indication information, when shifted into the shift register, along with at least a portion of the bits originally in the register, may identify second states that are connected to the first state via state transitions that are allowed by the trellis diagram.

VIII. Exemplary Trellis Traceback Apparatus for ADSL and SHDSL

The inventor has developed exemplary working trellis traceback apparatus for use with ADSL and SHDSL. The apparatus included the same general components and communication couplings as shown in FIG. 7. SHDSL involves two trellis branches leading to a trellis state, while ADSL involves four trellis branches leading to a trellis state. Table 2 lists the conventions used to assign trellis branch indication information to designate branches leading into a state for ADSL and SHDSL. These conventions are only illustrative and other conventions may also optionally be employed.

TABLE 2

| Branch | ADSL | SHDSL |
| --- | --- | --- |
| Top Branch Entering State | 00 | 0 |
| Second Branch Entering State | 01 | N/A |
| Third Branch Entering State | 10 | N/A |
| Bottom Branch Entering State | 11 | 1 |

The traceback depths of the trellis branch indication memories of the SHDSL and ADSL apparatus were 64 and 32, respectively, although this is not required. The inventor elected to make the depth configurable so that it may be more easily configured for different decoding accuracies, although this is not required. The trellis branch indication memories were organized as 4@ 64×128 memories and were logically controlled as 64×512 memories. All of the states selections may be stored in one address of the trellis branch indication memory. In the case of ADSL, bits 0:15 may be used to store 16 LSB branch select bits, and bits 16:31 may be used to store 16 MSB branch select bits. Unused memory in the case of ADSL may be used to store other information, such as un-encoded or hard decision bits corresponding to the possible soft decisions.

For each column of the trellis branch indication memory that is read, only one row, in the case of SHDSL, or two rows, in the case of ADSL, may be provided to the multiplexer or other selector. Note that the ADSL specification specifies that the convolution encoder in the transmitter be forced to the all zero state upon transmitting the last symbol. Accordingly, in the case of ADSL, when tracing back from the last symbol received, the traceback may start in state zero, instead of in the state with the lowest path metric.

IX. Implementation in Exemplary Computer System

Figure 8:
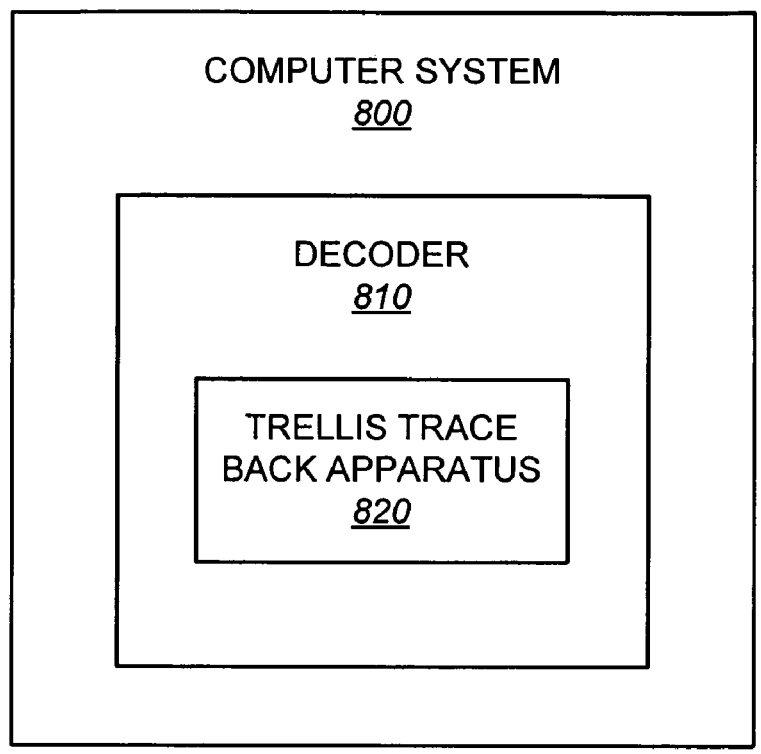
FIG. 8 is a block diagram of an exemplary computer system in which one embodiment of the invention may be implemented.

FIG. 8 is a block diagram of an exemplary computer system 800 in which one embodiment of the invention may be implemented. The computer system may represent an apparatus including hardware and/or software for processing data. In various embodiments, the computer system may include, but is not limited to, a laptop computer, desktop computer, server, mainframe, and the like.

It is recognized that such computer systems and their uses are known in the arts and are commercially available. As such, the computer system is shown in simplified block diagram form in order to avoid obscuring the description. However, a brief description of components that may be employed in conventionally computer systems is provided below.

Often, the computer system may include a bus to communicate information, a processor in communication with the bus to process information, a random access memory (RAM) or other dynamic storage device in communication with the bus to store information and instructions to be executed by the processor. The RAM may also be used to store the operating system, application software, and like instructions for processing data. The RAM is often referred to in the arts simply as main memory. Different types of RAM memory that are each employed in some, but not all computer systems, include static-RAM (SRAM) and dynamic-RAM (DRAM). The computer system may also include a read only memory (ROM) or other static storage device in communication with the bus to store static information and instructions for the processor, such as the BIOS. Different types of memory that are each employed in some, but not all, computer systems include Flash, programmable ROM (PROM), and erasable-and-programmable ROM (EEPROM).

Often, a drive for a magnetic disk, zip, optical disc, or other data storage device may be in communication with the computer system to store information and instructions. The computer system may also be in communication via the bus to a display device, such as a cathode ray tube (CRT) or liquid crystal display (LCD), to display information to an end user. Typically, a data input device, such as a keyboard or other alphanumeric input device including alphanumeric and other keys, may be in communication with the bus to communicate information and command selections to the processor. Another type of user input device is a cursor control device, such as a mouse, a trackball, or cursor direction keys, to communicate direction information and command selections to the processor and to control cursor movement on the display.

It is an aspect of one embodiment of the invention, that the computer system may also include a communication device. The communication device may be in communication with the bus to allow the communication system to communicate with a communication link or network. For example, the computer system may transmit and receive digital data, or other types of information. Depending upon the particular implementation, the communication device may include a modem, a network interface card, or other well-known interface devices, such as those used for coupling to Ethernet, token ring, or other types of physical attachment for purposes of providing a communication link to support a local or wide area network, for example. In one aspect, the communication device may support x-DSL communications. As an example, the communication device may include an ADSL modem compliant with G.992. As another example, the communication device may include an SHDSL modem. In one embodiment of the invention, the computer system may include an antenna to provide for wireless communications.

Now, as has been discussed elsewhere herein, errors may be introduced into the communication data, for example due to noise, faulty equipment, or other imperfections. The illustrated computer system includes a decoder 810, which may be a part of the communication device, and in communication with or coupled with the bus, to decode encoded symbols and perform error correction. As shown, the decoder may include a trellis traceback apparatus 820, according to one embodiment of the invention. This may allow the decoder to benefit from the advantages set forth elsewhere herein. As shown and described herein, it will often be appropriate to implement the decoder and trellis traceback apparatus in hardware. The hardware may be in a DSL modem, or integrated into the chipset, for example. However, in an alternate embodiment of the invention, at least a portion of the decoder, for example the trellis traceback apparatus, may be emulated in software or other instructions that may be executed, for example, by the processor.

Embodiments of the invention are not limited to any particular computer system. Rather, embodiments may be used on any stand alone, distributed, networked, or other type of computer system. For example, embodiments may be used on one or more computers compatible with NT, Linux, Windows, Macintosh, any variation of Unix, or others.

X. Implementation in Exemplary Portable Radio Communication Device

Figure 9:
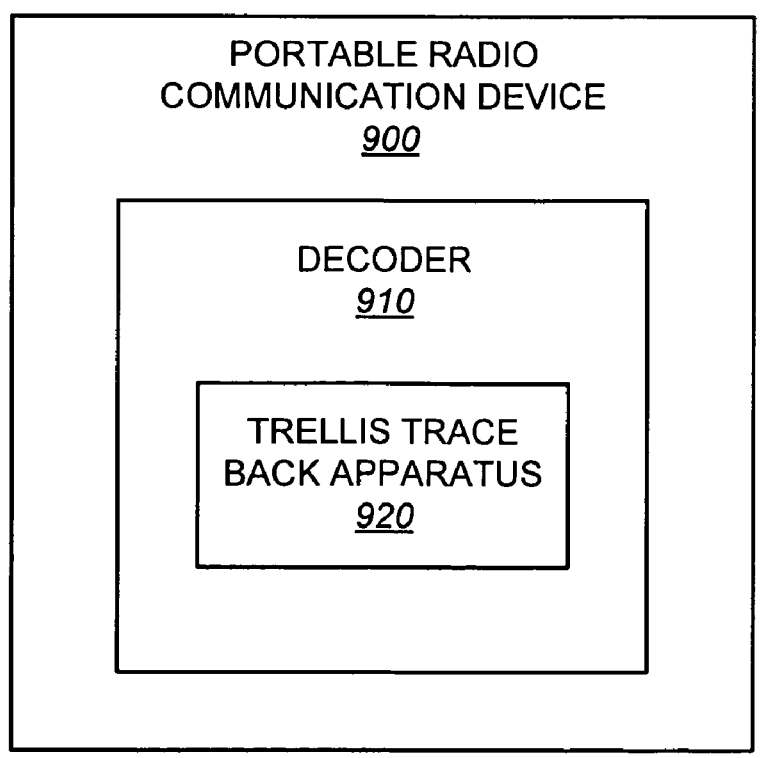
FIG. 9 is a block diagram of an exemplary portable radio communication device in which one embodiment of the invention may be implemented.

FIG. 9 is a block diagram of an exemplary portable radio communication device 900 in which one embodiment of the invention may be implemented. The portable radio communication device may represent a device including hardware and/or software for sending and receiving communication messages using radiofrequency energy. In various embodiments, the portable radio communication device may include, but is not limited to, a cell phone, pager, personal digital assistant (e.g., for email), wireless camera, and the like.

The portable radio communication device may receive digital data from a communications system. The communication device may include a conventional antenna for this purpose. In one embodiment of the invention, the communication device may include a GSM (Global System for Mobile Communications) transceiver. The GSM transceiver may allow for CDMA (Code Division Multiple Access) or TDMA (Time Division Multiple Access) communications, for example. This particular type of transceiver is typically employed in some, but not all, portable radio communication devices. Likewise, this particular type of transceiver is typically employed in some, but not all, cell phones. Another conventional component often included in the portable radio communication device is a memory. In the case of a cell phone, the memory may be used to store phone numbers, and the like. A type of memory that is often employed in some, but not all, portable radio communication devices, including in some, but not all, cell phones, is a Flash memory. A potential advantage of the Flash memory is that information may be retained without power, so that stored information, for example phone numbers, will not be lost.

Now, as previously discussed, the received digital data may potentially incorporate errors. The portable radio communication device may include a decoder 910, according to one embodiment of the invention, to perform decoding and error correction. As shown, the decoder may include a trellis traceback apparatus 920, according to one embodiment of the invention. It will be appreciated that although the decoder and trellis traceback apparatus will often be implemented in hardware, they may also be implemented in software, if desired.

It is recognized that such communication devices, and their uses, are known in the arts, and are commercially available. As such, the device is shown in simplified block diagram form. The communication device may include conventional components. These conventional components will not be discussed in further detail in order to avoid obscuring the description.

XI. Other Matters

In the description above, for the purposes of explanation, numerous specific details have been set forth in order to provide a thorough understanding of the embodiments of the invention. It will be apparent, however, to one skilled in the art, that other embodiments may be practiced without some of these specific details. In other instances, well-known circuits, structures, devices, and techniques have been shown in block diagram form or without detail in order not to obscure the understanding of this description.

An embodiment of the invention may include various operations. The operations of the embodiment may be performed by hardware components, or may be embodied in machine-executable instructions, which may be used to cause a general-purpose or special-purpose processor or logic circuits programmed with the instructions to perform the operations. Alternatively, the operations may be performed by a combination of hardware and software.

An embodiment of the invention may be provided as a program product or article of manufacture, which may include a machine-readable storage device or medium having stored thereon an instruction or instructions, which may be used to program a machine or apparatus, such as a micro-electronic device, a microprocessor, an Application Specific Integrated Circuit (ASIC), a digital signal processor, a computer system, or other machine or apparatus, to perform a process. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, an embodiment of the invention may also be downloaded as a computer program product, wherein the program may be transferred from one computer to another computer by way of data signals embodied in a carrier wave or other propagation medium via a communication link (e.g., a modem or network connection).

Many of the methods are described in their most basic form, but operations may be added to or deleted from the methods. It will be apparent to those skilled in the art that many further modifications and adaptations may be made. The particular embodiments are not provided to limit the invention but to illustrate it. The scope of the invention is not to be determined by the specific examples provided above but only by the claims below.

In the claims, any element that does not explicitly state "means for" performing a specified function, or "step for" performing a specified function, is not to be interpreted as a "means" or "step" clause as specified in 35 U.S.C. Section 112, Paragraph 6. In particular, the use of "step of" in the claims herein is not intended to invoke the provisions of 35 U.S.C. Section 112, Paragraph 6.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features are sometimes grouped together in a single embodiment, Figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

While the invention has been described in terms of several embodiments, those skilled in the art will recognize that the invention is not limited to the embodiments described, but may be practiced with modification and alteration within the spirit and scope of the appended claims. The description is thus to be regarded as illustrative instead of limiting.

What is claimed is:

1. An apparatus comprising:

a branch indication memory having a plurality of memory locations to store branch indication information for each of a plurality of states at each of a plurality of sections, the branch indication information indicating a branch that is most likely to lead to a state;

a memory address logic in communication with the branch indication memory, the memory address logic to indicate a subset of the plurality of memory locations, the subset including memory locations to store branch indication information for each of the plurality of states at an indicated section;

a selector in communication with the branch indication memory, the selector to receive the branch indication information for each of the plurality of states at the indicated section, the selector to select a portion of the received branch indication information based on selection information; and a shift register in communication with the selector, the shift register including a plurality of register segments to store information, the plurality of register segments including a first segment in communication with the selector to receive and store the selected portion of the branch indication information, the shift register in communication with the selector to provide the information stored in the plurality of register segments to the selector as the selection information.

2. The apparatus of claim 1, wherein the memory address logic comprises a down counter.

3. The apparatus of claim 1, wherein the plurality of register segments of the shift register comprise a number of register segments that is based on a number of states of a trellis.

4. The apparatus of claim 1, wherein the plurality of register segments of the shift register comprise (k-1) segments, where k is the constraint length, and wherein the number of states comprises $2^{(K-1)}$ states.

5. The apparatus of claim 1, implemented in a portable radio communication device comprising a Flash memory.

6. The apparatus of claim 1, implemented in a cell phone comprising a GSM transceiver.

7. The apparatus of claim 1, implemented in a computer system comprising a DRAM memory.

8. An apparatus comprising:
a branch indication memory to store branch indication information for a state at a section of a plurality of sections of the branch indication memory, the branch indication information indicating a branch that leads to the state;

a memory address logic comprising a counter in communication with the branch indication memory to indicate the section with a value of the counter, the section including the branch indication information for the state and branch indication information for other states at the indicated section;

a selector in communication with the branch indication memory to receive the branch indication information for the state at the indicated section and the branch indication information for the other states at the indicated section, the selector to select the branch indication information for the state instead of the branch indication information for the other states at tire indicated section based on received selection information;

a shift register in communication with the selector to provide information stored in a plurality of register segments to the selector as the selection information, and to receive and store the selected branch indication information.

9. The apparatus of claim 8, wherein the selector comprises a multiplexer.

10. The apparatus of claim 8, wherein the plurality of register segments of the shift register comprise a number of register segments that is based on a number of states of a trellis.

11. The apparatus of claim 10, wherein the number of register segments is based on a constraint length.

12. The apparatus of claim 11, wherein the number of register segments comprises (k-1) segments, where k is the constraint length, and wherein the number of states comprises $2^{(k-1)}$ states.

13. The apparatus of claim 8, implemented in a portable radio communication device comprising a Flash memory coupled with the apparatus to store information.

14. The apparatus of claim 8, implemented in a cell phone comprising a GSM transceiver coupled with the apparatus to receive data from a communications system and provide the data to the apparatus.

15. The apparatus of claim 8, implemented in a computer system comprising a DRAM memory coupled with the apparatus to store information.

16. An apparatus comprising:
a DRAM memory to store information;
a communication device to receive information from a communication system; and
a decoder to perform error correction on the information received system, the decoder comprising:
a branch indication memory to store branch indication information for a state at a section, the branch indication information indicating a branch that leads to the state;
a memory address logic in communication with the branch indication memory to indicate the section;
a selector in communication wit the branch indication memory to receive the branch indication information for the state at the indicated section, the selector to select the branch indication information based on received selection information; and
a shift register in communication with the selector to provide information stored in a plurality of register segments to the selector as the selection information, and to receive and store the selected branch indication information.

17. The apparatus of claim 16, wherein the memory address logic comprises a down counter.

18. The apparatus of claim 16, wherein the plurality of register segments of the shift register comprise a number of register segments that is based on a number of states of a trellis.

19. The apparatus of claim 18, wherein the number of register segments comprises (k-1) segments, where k is the constraint length, and wherein the number of comprises $2^{(k-1)}$ states.

20. A method comprising:
storing branch indication information in a branch indication memory having a plurality of sections;
selecting a section of the branch indication memory with a value of a counter;
outputting from the branch indication memory a plurality of branch indication information each for a different state;
selecting a particular branch indication information of the plurality of branch indication information for a particular state of the plurality of states at the selected section based on informationthatis stored in a shift register;
storing the selected branch indication information in the shift register; and
shifting the branch indication information out of the shift register to uniquely decoded and error corrected information.

21. The method of claim 20, wherein selecting the branch indication information for the state comprises using k-1 bits of information stored in the shift register to uniquely select the branch indication information for the state out of a larger set of branch indication information for $2^{(k-1)}$ unique states.

22. The method of claim 20, further comprising providing the decoded information to an apparatus that is selected from the group consisting of a computer system comprising a DRAM memory coupled with the apparatus to store information, a portable radio communication device comprising a Flash memory coupled with the apparatus to store information and a cell phone comprising a GSM transceiver coupled with the apparatus to receive data from a communications system and provide the data to the apparatus.

23. An article comprising:
a storage medium having stored thereon data representing sequences of instructions that if executed cause a decoder to:
store branch indication information in a branch indication memory having a plurality of sections;
select a section of the branch indication memory based on a value of a counter;
provide from the branch indication memory branch indication information for a plurality of different states;
select branch indication information for a state of the plurality of different states at the selected section based on informationthatis stored in a shift register;
store the selected branch indication information in the shift register; and
shift the branch information out of the shift register in order to error corrected information.

24. The article of claim 23, wherein the instructions further comprise instructions that if executed cause the decoder to: provide the decoded information to an apparatus that is selected from the group consisting of a computer system comprising a DRAM memory coupled with the apparatus to store information, a portable radio communication device comprising a Flash memory coupled with the apparatus to store information, and a cell phone comprising a GSM transceiver coupled with the apparatus to receive data from a communications system and provide the data to the apparatus.

* * * * *

UNITED STATES PATENT AND TRADEMARK OFFICE
CERTIFICATE OF CORRECTION

| | | |
|---|---|---|
| PATENT NO. | : 7,359,464 B2 | Page 1 of 1 |
| APPLICATION NO. | : 10/749482 | |
| DATED | : April 15, 2008 | |
| INVENTOR(S) | : Cohen | |

It is certified that error appears in the above-identified patent and that said Letters Patent is hereby corrected as shown below:

In column 6, at line 31, delete "on" and insert --of--.

Signed and Sealed this

Eighteenth Day of November, 2008

JON W. DUDAS
*Director of the United States Patent and Trademark Office*